United States Patent [19]

Yamazaki et al.

[11] Patent Number: 5,145,711
[45] Date of Patent: * Sep. 8, 1992

[54] CYCLOTRON RESONANCE CHEMICAL VAPOR DEPOSITION METHOD OF FORMING A HALOGEN-CONTAINING DIAMOND ON A SUBSTRATE

[75] Inventors: Shunpei Yamazaki, Tokyo; Shigenori Hayashi, Atsugi, both of Japan

[73] Assignee: Semiconductor Energy Laboratory Co., Ltd., Kanagawa, Japan

[*] Notice: The portion of the term of this patent subsequent to May 14, 2008 has been disclaimed.

[21] Appl. No.: 481,720

[22] Filed: Feb. 16, 1990

Related U.S. Application Data

[63] Continuation of Ser. No. 225,860, Jul. 29, 1988, abandoned, which is a continuation-in-part of Ser. No. 178,362, Apr. 6, 1988, abandoned.

[30] Foreign Application Priority Data

| Aug. 10, 1987 | [JP] | Japan | 62-200351 |
| Jul. 17, 1988 | [JP] | Japan | 63-177847 |
| Jul. 17, 1988 | [JP] | Japan | 63-177848 |
| Jul. 17, 1988 | [JP] | Japan | 63-177849 |

[51] Int. Cl.$^5$ .............................. B05D 3/06
[52] U.S. Cl. .................... 427/38; 427/39; 427/45.7; 427/47; 427/249; 427/122; 427/45.1; 423/446; 428/408; 118/723

[58] Field of Search ............. 427/38, 39, 249, 45.1, 427/47, 122; 423/446; 118/723; 428/408

[56] References Cited

U.S. PATENT DOCUMENTS

| 4,663,183 | 5/1987 | Ovshinsky et al. | 427/39 |
| 4,816,289 | 3/1989 | Hirose | 427/39 |

FOREIGN PATENT DOCUMENTS

| 61-158898 | 7/1986 | Japan. |
| 61-286299 | 12/1986 | Japan. |

OTHER PUBLICATIONS

Kawarada et al., "Large Area Chemical Vapor Deposition of Diamond Particles and Films Using Magneto-Microwave Plasma", Japanese Journal of Applied Physics, vol. 26, No. 6, Jun., 1987, pp. LL1032-LL1034.

Primary Examiner—Shrive Beck
Assistant Examiner—Roy V. King
Attorney, Agent, or Firm—Sixbey, Friedman, Leedom & Ferguson

[57] ABSTRACT

Diamond films or i-carbon films can be formed on a surface by virtue of cyclotron resonance chemical vapor deposition. The characteristics such as transmissivity, conductivity and hardness of the films can be easily controlled by introducing a halogen into the films.

10 Claims, 13 Drawing Sheets

CYCLOTRON RESONANCE CHEMICAL VAPOR DEPOSITION METHOD OF FORMING A HALOGEN-CONTAINING DIAMOND ON A SUBSTRATE

This application is a continuation of Ser. No. 07/225,860, filed Jul. 29, 1988, now abandoned, which is a Continuation-in-Part of Ser. No. 07/178,362, filed Apr. 6, 1988, now abandoned.

BACKGROUND OF THE INVENTION

This invention relates to a carbon material and a carbon deposition method, and more particularly, relates to a carbon deposit containing a halogen and a fabricating method therefor.

Recently, ECR (Electric Cyclotron Resonance) CVD has attracted the interest of researchers as a new method of manufacturing thin films, particularly amorphous thin films. For example, Matsuo et al discloses one type of such as ECR CVD apparatus in U.S. Pat. No. 4,401,054. This recent technique utilizes microwave energy to energize a reactive gas such that it develops into a plasma. A magnetic field functions to pinch the plasma gas within the excitation space. Within this excitation space, the reactive gas can absorb the energy of microwaves. A substrate to be coated is located distant from the excitation space (resonating space) for preventing the same from being spattered. The energized gas is showered onto the substrate from the resonating space. In order to establish electron cyclotron resonance, the pressure in a resonating spaces is kept at $1 \times 10^{-5}$ Torr at which pressure electrons can be considered as independent particles and resonant with the microwave energy in an electron cyclotron resonance on a certain surface on which the magnetic field strength meets the requirement for ECR. The excited plasma is extrated from the resonating space, by means of a divergent magnetic field, and is conducted to a deposition space which is located distant from the resonating space and in which there is disposed a substrate to be coated.

In such a prior art method, it is very difficult to perform carbon deposition of a polycrystalline or single-crystalline structure, so that currently available methods are substantially limited to processes for manufacturing amorphous films. Also, high energy chemical vapor reaction can not be readily accomplished by such a prior art and therefore it has not been possible to form diamond films or other films having high melting points, or uniform films on a surface having depressions and caves can not be formed. Furthermore, it was impossible to coat the surface of a super hard metal such as tungsten carbide with a carbon film. Because of this it is necessary to coat a super hard surface with a fine powder of diamond for use of abrasive which has a sufficient hardness and to make sturdy mechanical contact between the diamond powder and the substrate surface.

Furthermore, it is effective to deposit a hard film on a surface of glass, plastic, metal, resin and so forth for the purpose of protecting the surface from mechanical attachs such as abrasive or scratching attachs. Films made of $Al_2O_3$, TiN, BN, WC, SiC, $Si_3N_4$ and $SiO_2$ and those described in Japanese Patent Application No. Sho56-146930. However, such conventional protecting films have high resistivities and, as a result, tend to generate static electricity which collects dust and fine particles on their surface from the surrounding atmosphere. On the other hand, when used in the application utilizing static electricity, the films aging is accelerated because of the electric charge accumulated on the films.

To avoid such a shortcoming, a conductive substance may be added into the protecting films. In such a case, however, the added substance plays as the absorption center of the incident light so that the added films can not be used for application in which transmissivity of protecting films is required.

Still further, it is likely that such conventional films are peeled off because of accumulated internal stress depending on the deposition condition. Accordingly, the thickness has to be reduced or an intermediate film having a high adhesivity has to be interposed between the protecting film and the underlying surface.

SUMMARY OF THE INVENTION

It is therefore an object of the invention to provide an excellent carbon material and a fabricating method therefor.

It is another object of the present invention to provide an excellent carbon material having a high adhesivity.

It is a further object of the present invention to provide an excellent carbon material whose characteristics can be easily controlled.

It is a still further object of the present invention to provide an excellent carbon material accumulating little stress therein.

According to one aspect of the invention, in addition to a hydrocarbon, a halogen gas or halogen compound gas is introduced into the reaction chamber. Examples of halogen compound gases are fluorine compounds such as $NF_3$, $SF_3$ and $WF_6$, chlorine compounds such as $CCl_4$, bromine compounds such as $CH_3Br$ and iodine compounds. The carbon material formed in accordance with the present invention contains a halogen at 0.1–50 atom % which is controlled by adjusting the introduction rate of the halogen compound gas.

Among halogens, fluorine is most useful from the view point of avoiding corrosion of the inner wall of the reaction chamber. The carbon compound gas does preferably not include a halogen element, so that the proportion of halogen additive can be easily controlled. In case of the reaction between $CH_4$ and $CF_4$, radical carbon atoms are generated in accordance with the below equation:

$$CH_4 + CF_4 \rightarrow 2C + 4HF$$

The conductivity, transparency and hardness of carbon material vary in accordance with the proportion of halogen. In what follow, experimental results are described.

Figure 1:
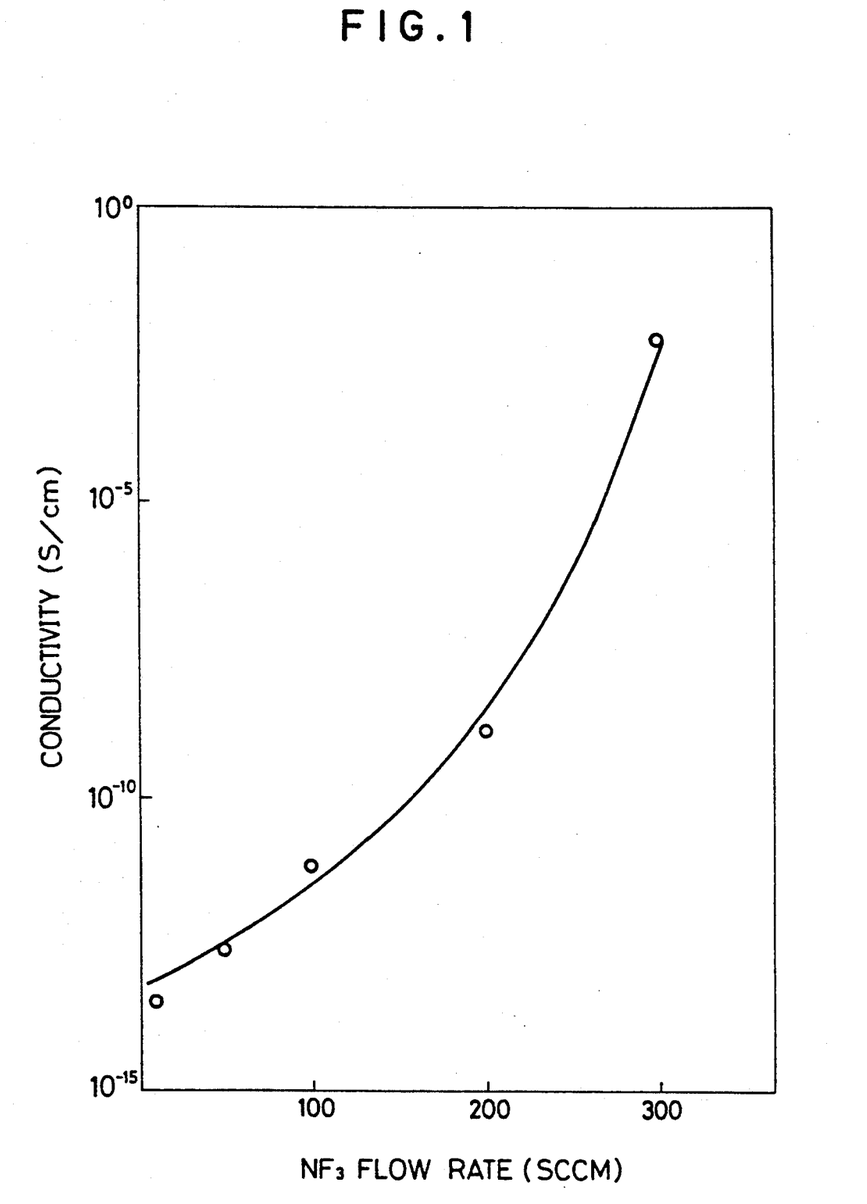
FIG. 1 is a graphical diagram showing the relation between the conductivity and the $NF_3$ rate in accordance with the present invention.
Figure 2:
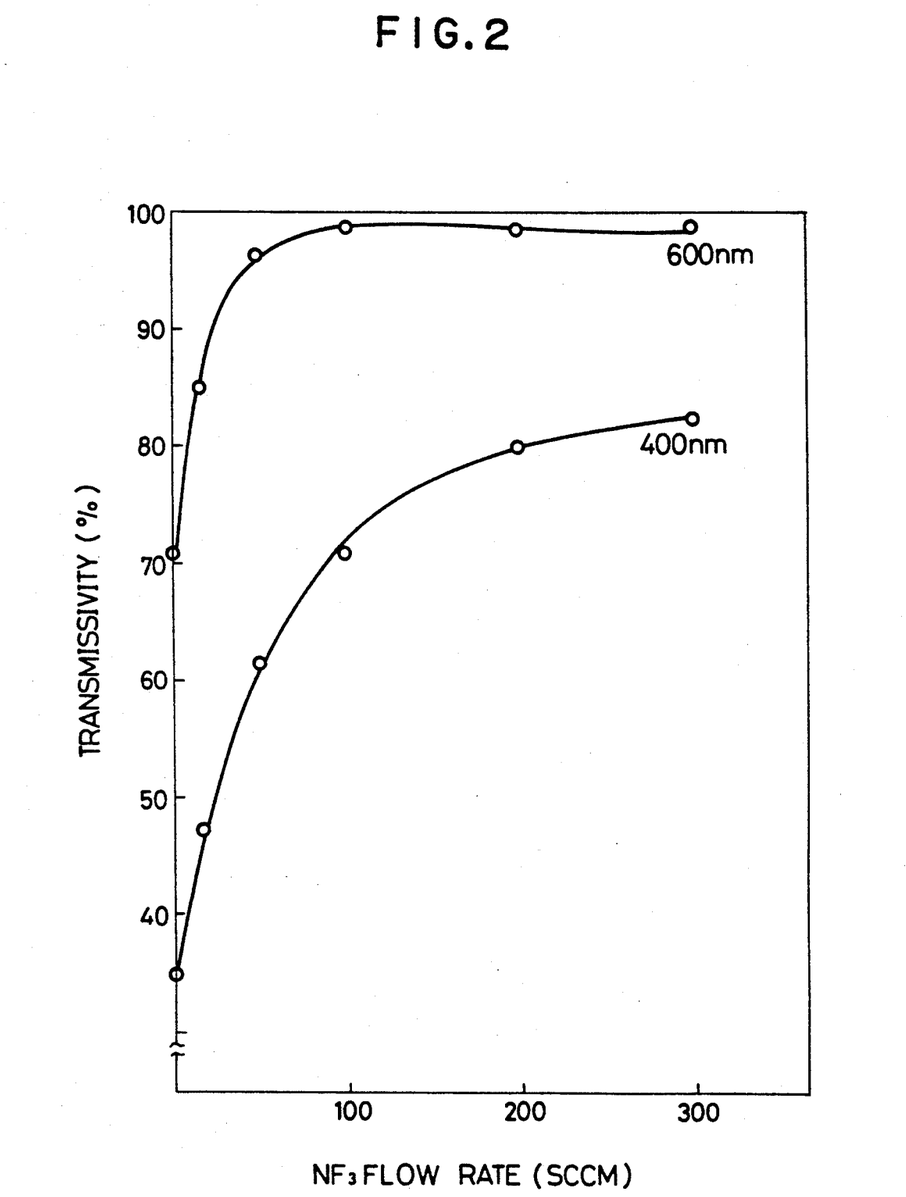
FIG. 2 is a graphical diagram showing the relation between the transmissivity and the $NF_3$ rate in accordance with the present invention.
Figure 3:
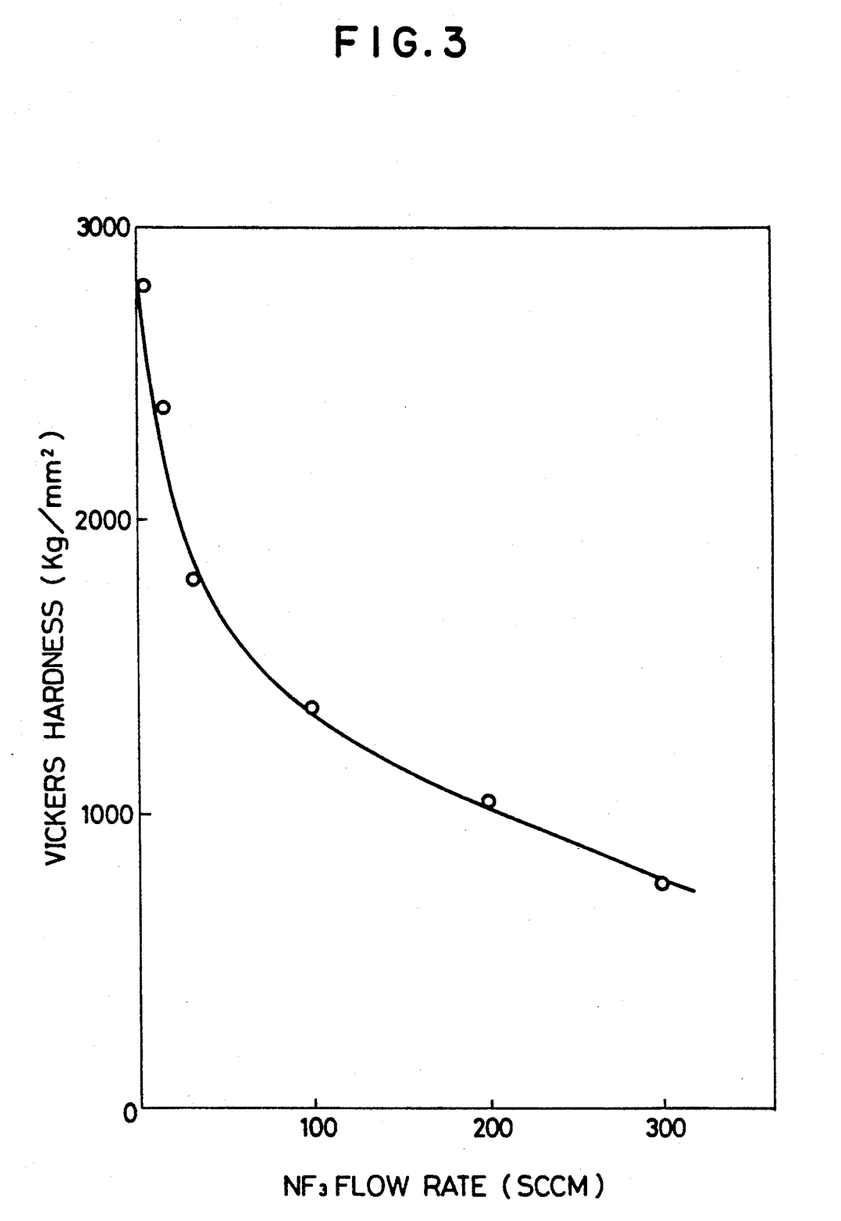
FIG. 3 is a graphical diagram showing the relation between the Vickers hardness and the $NF_3$ rate in accordance with the present invention.

Carbon coatings were deposited using ethylene introduced at 10 SCCM and $NF_3$ introduced at varied rates. The pressure in a reaction chamber was 10 Pa and input power was 0.08 W/cm$^2$. The relationship between the conductivity and the introduction rate of $NF_3$ in FIG. 1. The conductivity increased as the rate increased. The relationship between the transparency and the introduction rate is plotted in FIG. 2. The transparency increased as the rate increased. The relationship between the hardness and the introduction rate is plotted in FIG. 3. The hardness decreased as the rate increased. The decrease of the hardness means the decrease of the inner stress.

Figure 4:
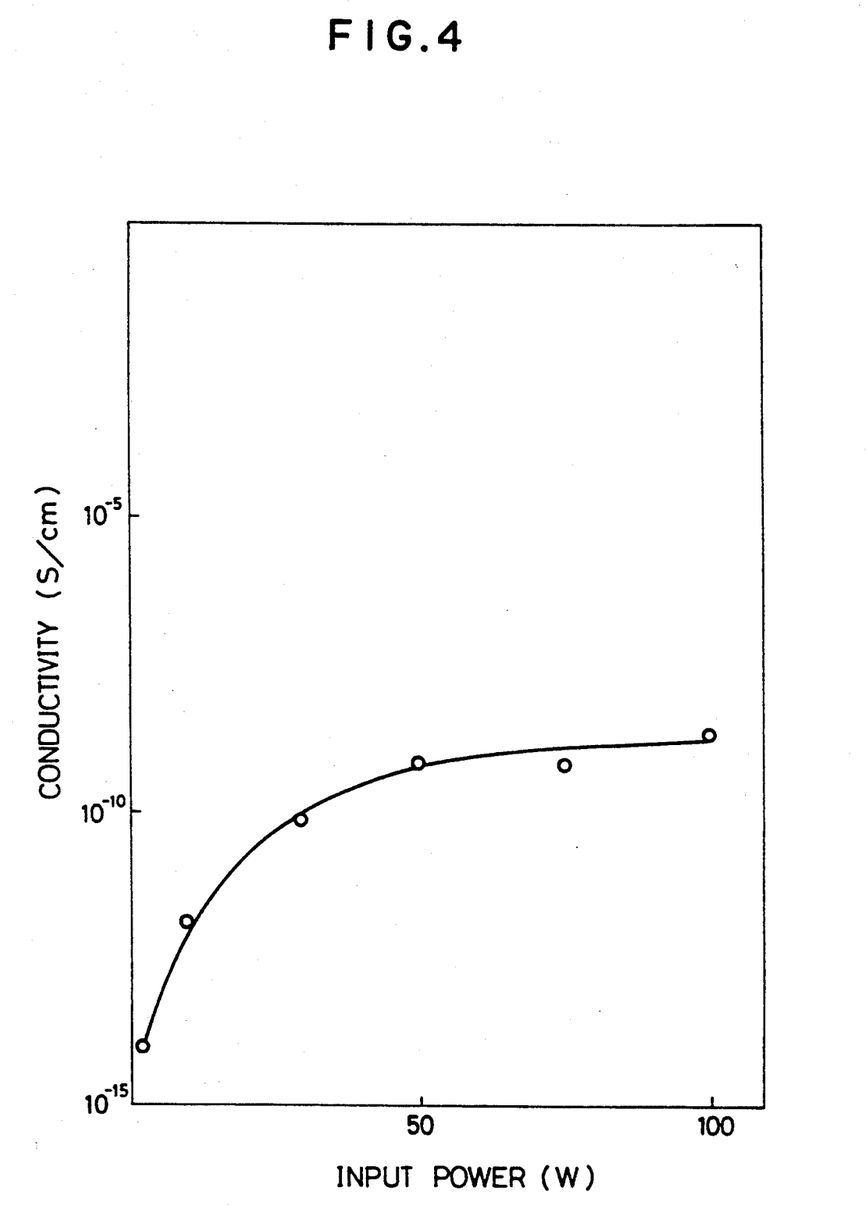
FIG. 4 is a graphical diagram showing the relation between the conductivity and the input power in accordance with the present invention.

As described above, the conductivity, hardness, transparency of films deposited in accordance with the present invention can be easily controlled over wide ranges. An optimal property required for a particular application can be attained at a relatively low production cost. The proportion of a halogen can be controlled by changing the introduction rate of the halogen compound gas while other deposition conditions are kept constant. However, the proportion can be changed when the input power, the reaction pressure, the shape of the discharge vessel and/or the introduction rate of the carbon productive gas are changed. For instance, the variation of the conductivity when the input power is changed is plotted in FIG. 4. As shown in the diagram, the conductivity increases as the input power increases. Of course, other deposition conditions such as the $NF_3$ flow rate and $C_2H_4$ flow rate were maintained constant for plotting FIG. 4.

Another advantage of the present invention is low internal stress occuring in films deposited. Dangling bonds have a tendency to increase the stress. The dangling bonds can be terminated by hydrogen atoms introduced into carbon films. However, even with the hydrogen atoms, some proportion of dangling bonds inevitably still remain without termination which might be a cause of internal stress. Hence, if a halogen such as fluorine exists in the plasma gas, C—F bonds are easily created and, as a result, the density of dangling bonds is substantially reduced by the termination by fluorine atoms.

A further advantage of the present invention is high heat-resistant property.

A still further advantage of the present invention is low process temperatures. At these low temperatures, carbon coating can be formed even on selenium or organic materials such as plastics.

According to another aspect of the invention, a new CVD process is proposed which utilizes a mixed cyclotron resonance. In the improved exciting process, sonic action of the reactive gas itself must be taken into consideration as a non-negligible perturbation besides the interaction between respective particles of the reactive gas and the magnetic field and microwave, and as a result charged particles of a reactive gas can be energized in a relatively wide resonating space. Preferably, the pressure is maintained higher than 3 Torr. For the mixed resonance, the pressure in a reaction chamber is elevated $10^2$–$10^5$ times as high as that of the prior art. For example, the mixed resonance can be established by increasing the pressure after ECR takes place at a low pressure. Namely, first a plasma gas is placed in ECR condition at $1 \times 10^{-3}$ to $1 \times 10^{-5}$ Torr by inputting microwaves under the existence of magnetic field. Then a reactive gas is inputted into the plasma gas so that the pressure is elevated to 0.1 to 300 Torr and the resonance is changed from ECR to MCR (Mixed Resonance).

DETAILED DESCRIPTION OF THE PREFERRED EMBODIMENTS

Figure 5:
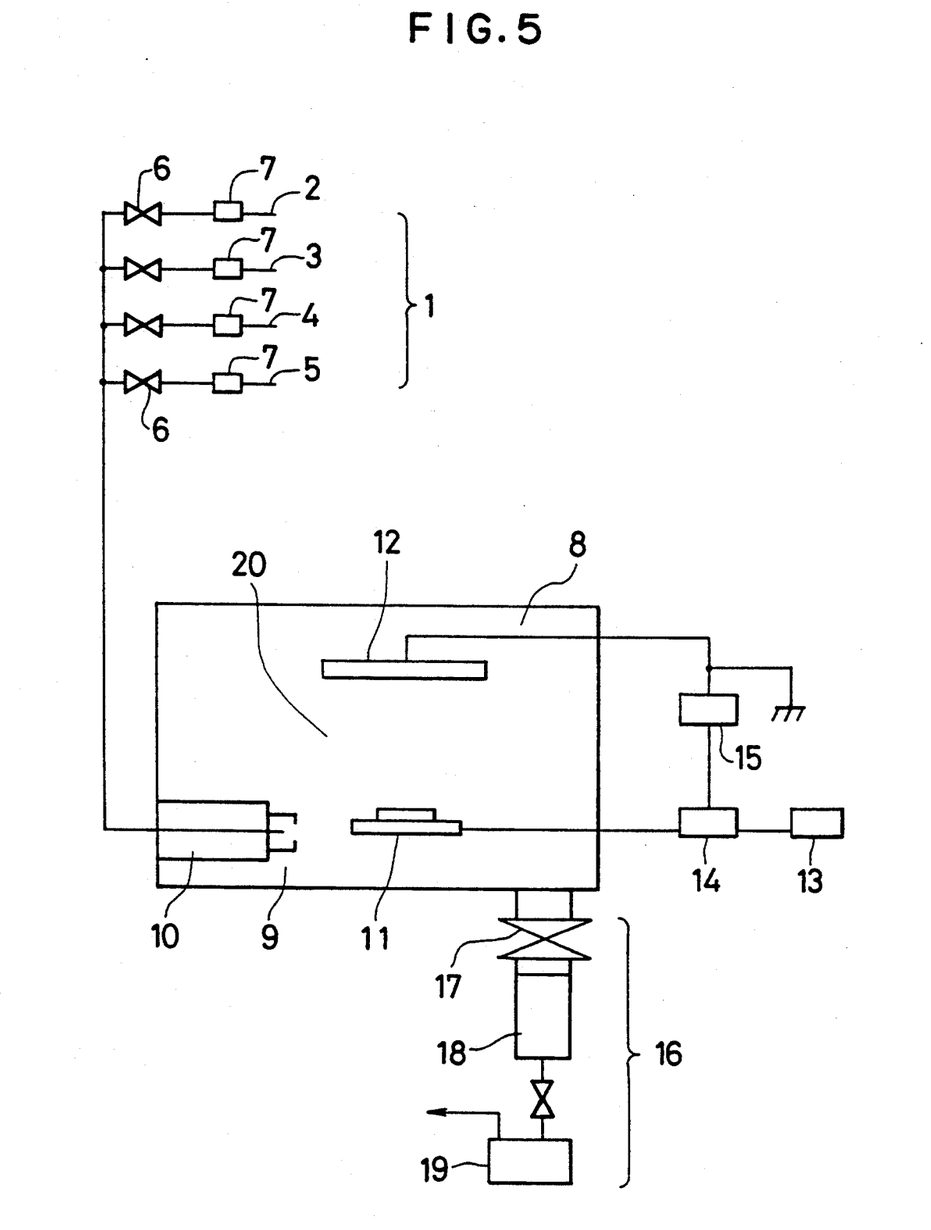
FIG. 5 is a cross section view showing a CVD apparatus in accordance with the present invention.

Referring to FIG. 5, a plasma CVD apparatus for depositing carbon material on a surface in accordance with the present invention. The surface to be coated is for example made of glasses, metals, ceramics, organic resins and so forth.

The apparatus comprises a reaction chamber defining a reaction space therein, first and second electrodes 11 and 12, a high frequency electric power source 13 for supplying an electric power through a matching transformer 14, a DC bias source 15 connected in series between the electrodes 11 and 12, a gas feeding system 1 consisting of four passages each of which is provided with a flow meter 7 and a valve 6, a microwave energy supply 10 for exciting gases from the feeding system 1, a nozzle 9 through which gas excited by the microwave energy supply 10 is introduced into the reaction space 20, and an exhausting system 16 including a pressure control valve 17, a turbo molecular pump 18 and a rotary pump 19. The electrodes are designed such that (the area of the first electrode 11)/(the area of the second electrode 12) <1.

In this apparatus, a carrier gas of hydrogen is introduced to the reaction space 20 from the gas feeding passage 2 as well as a reactive gas of a hydrocarbon such as methane or ethylene from the gas feeding passage 3. In addition to this, a halogen compound gas such as $NF_3$ is inputted to the reaction space 20 through the gas feeding passage 4. Pre-excitation may be affected by the microwave energy supply 10. The pressure in the reaction space is maintained within the range between 0.001 to 10 Torr, preferably 0.01 to 1 Torr. A high frequency electric energy at a frequency not lower than 1 GHz, preferably 2.45 GHz, is applied to the reactive gas at 0.1 to 5 kilo Watt for breaking C—H bonds. When the frequency is selected to be 0.1 to 50 MHz, C≡C bonds can be broken and transformed to —C—C—bonds. By virtue of this reaction, carbon atoms are deposited with a few halogen atoms in the form of a structure in which the diamond structure occurs at least locally.

A bias voltage of −200 to 600 V is set at the DC bias source 15. The effective bias voltage level is substantially −400 to +400 V since a self bias level of −200 V is spontaneously applied between the electrodes 11 and 12 with the bias voltage level at the source 15 being zero.

Figure 6:
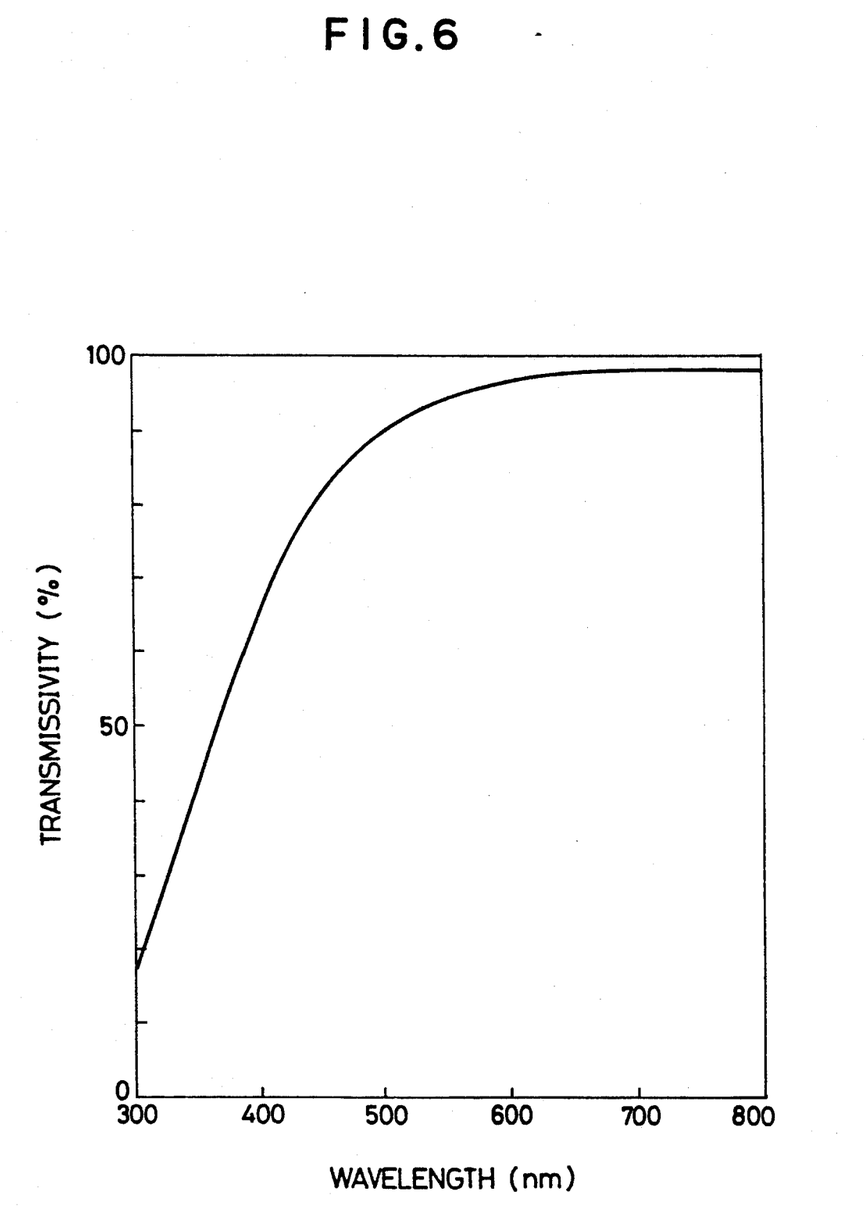
FIG. 6 is a graphical diagram showing the relation between the transmissivity and the wavelength in accordance with the present invention.

An experiment was carried out in the deposition conditions in which the high frequency input power was chosen between 50 Watt and 1 kilo Watt, e.g., 60 Watt, the pressure in the reaction space was 0.015 Torr, the flow rate of ethylene was 100 SCCM, the flow rate of $NF_3$ was 100 SCCM, the substrate temperature was room temperature, and the deposition time was 30 minutes. This input power corresponds to 0.03 to 3 Watt/cm$^2$ in terms of plasma energy. The transmissivity of the deposited carbon film containing fluoride atoms were measured and plotted in FIG. 6. As shown in the diagram, the transmissivity was not lower than 95% at wavelengths longer than 600 nm and not lower than 50% at a wavelength of 400 nm. The vickers hardness was measured to be 1000 to 2500 kg/cm$^2$. The internal stress was measured to be as small as no higher than $10^7$ dyn/m$^2$. No deterioration was appreciable of the surface of the deposited film, when examined by means of an optical microscope at an 400 times magnification, after the surface was immersed for an hour in caustic chemicals such as acids, alkalis, organic solvents and the like. Also, no appreciable change was observed after leaving the film in an incubator at 500° C. for an hour.

Figure 7:
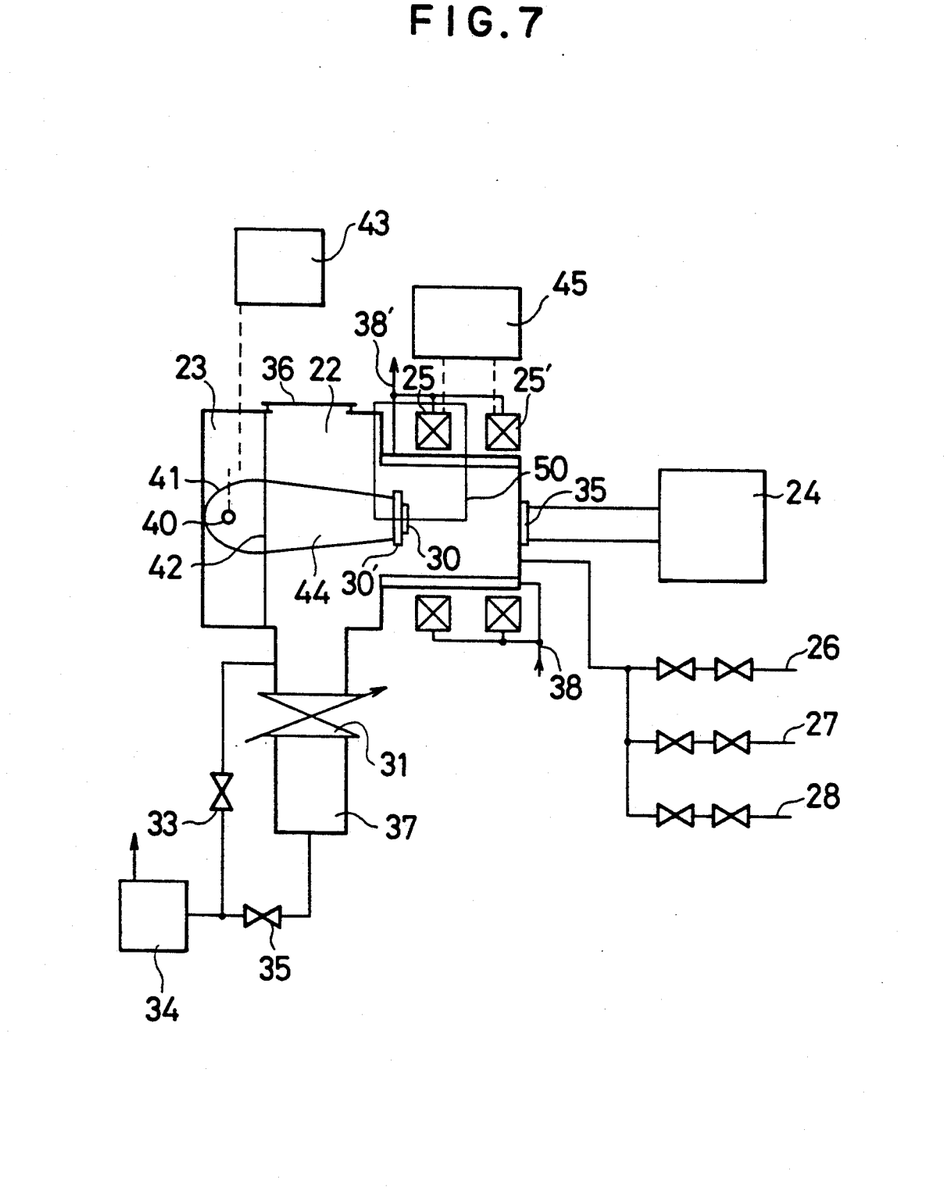
FIG. 7 is a cross section view showing another CVD apparatus in accordance with the present invention.

Referring to FIG. 7, an exemplary microwave enhanced plasma CVD apparatus in accordance with the present invention is illustrated as a second embodiment. As shown in the figure, the apparatus comprises a reaction chamber in which a plasma generating space 21 and an auxiliary space 22 are defined which can be maintained at an appropriate negative pressure, a microwave generator 24 electro-magnets 45 and 45' in the form of Helmholtz coils surrounding the space 21, a power supply 45 for supplying an electric power to the electromagnets 25 and 25', and a water cooling system 38.

The plasma generating space 21 has a circular cross section, and within the plasma generating space, there is provided a substrate holder 30', made of a material which provokes minimum disturbance of magnetic field created by the magnets 25 and 25' in the chamber, e.g., made of stainless steel or quartz. A substrate 30 is mounted on the holder 30'. The substrate holder 30' is irradiated and heated to 800°–1000° C. in the atmosphere of a high temperature plasma gas by means of an infrared radiation 44, which is emitted from an IR heater 40, reflected from an IR reflection parabolic mirror 41 and focused on the back surface of the holder 30' through a lens 42. Reference numeral 43 designates a power supply for the IR heater 40. Provided for evacuating the reaction chamber is an evacuating system comprising a turbo molecular pump 37 and a rotary pump 34 which are connected with the reaction chamber through pressure controlling valves 31, 33 and 35. The substrate temperature may reach a sufficient level solely by virtue of the plasma gas generated in the reaction chamber and, in the case, the heater can be dispensed with. Further, depending on the condition of the plasma, the substrate temperature might become too high to enable a suitable reaction to occur, in which case cooling means for the substrate has to be provided.

In use of the above described apparatus, a substrate 30 of silicon wafer is mounted on a substrate holder 30', and the reaction chamber is evacuated to $1 \times 10^{-6}$ Torr or a higher vacuum condition. Then, hydrogen gas is introduced from a gas introducing system 26 at 100 SCCM to fill the plasma generating space 21, and microwave energy at a power level of 1 kilo Watts and a frequency of 2.45 GHz is injected from the microwave generator through a microwave introduction window 35 into the plasma generating space 21 which is subjected at the same time to a magnetic of about 2 K Gauss generated by the magnets 25 and 25'. The magnets are adapted to adjust the magnetic field strength. The hydrogen is excided into a high density plasma state in the space 21. The surface of the substrate 30 is cleaned by high energy electrons and hydrogen atoms. In addition to the introduction of hydrogen gas, a productive gas comprising a hydrocarbon such as $C_2H_2$, $C_2H_4$, $C_2H_6$, $CH_3OH$, $C_2H_5OH$ or $CH_4$ and a halogen compound gas such as $CF_4$, $C_2F_2$, $C_2F_4$, $C_2Cl_2$ or $C_2Cl_4$ are inputted at 30 SCCM (total rate) through a gas introduction system 27. The proportion of halogen compound gas is 50%. The introduction rate of a carrier gas (hydrogen) is selected between 30 and 0, for example 2.

Since chlorine is somewhat corrosive, fluorine is most suitable in view of easiness of handling and highly reactiveness to hydrogen. The reactive gas and the carrier gas are preferably non-oxide gases since, if water is composed, strong acids such as HF and HCl might be composed.

Then, carbon atoms excited to high energy states are generated at 150°–500° C., and deposited on the substrate 30 on the substrate holder 30' in the form of a film of 0.1 to 100 microns thickness containing fluoride. The pressure of the reactive gas is 3–800 Torr, preferably a pressure not lower than 10 Torr such as 10–760 Torr. The carbon film had a smooth surface and was abrasion-proof and corrosion-proof, and therefore suitable for applications to instruments for chemical experimentation.

In addition to the above described reactive gas, Ni(CO)$_4$ at 1 SCCM (and GeH$_4$ at 2 SCCM in addition, if necessary) as a catalyst may be inputted to the reaction chamber from the introduction system, the proportion of the catalyst to the carbon compound gas being 0.1% to 10%. NiF, NiO, NiF(H$_2$O)$_n$ (where n = 1.3), Ni(CN)$_2$, Ni(C$_5$H$_5$)$_2$, GeH$_4$, GeF$_4$, manganese carbonyl, MnF$_2$ and the like are examples of other catalysts. They can be used respectively alone or combinations. The CVD reaction which occurs results from carbon atoms being excited to a high energy condition and heated to 150°–500° C. by virtue of the plasma gas and the heater 40 so that the substrate 30 mounted on the substrate holder 30' is coated with carbon in the form of a 0.1–100 microns thick film of i-carbon (insulated carbon consisting of microcrystals) or diamond having a grain diameter of from 0.1 to 100 microns. In accordance with experiments, it took only two hours to deposit a carbon film having an average thickness of 5 microns. The deposition speed can be increased by applying a bias voltage to the substrate holder. The carbon product in accordance with the present invention is characterized that at least 50% of carbon atoms have been connected by sp$^3$ bonds.

For reference, a film formation process was performed in the same manner as in the above but without using a catalyst. As a result, it took 15 hours to form a carbon film having an average thickness of 4 microns. It was confirmed by a metal microscope (1000 times magnification) that the unevenness of the surface of the film was significant. In accordance with the present invention, since innumerable seeds of catalyst prevail over the surface to be coated, carbon films can be formed with flat surfaces.

In case using the reactive gas of $CH_4:CF_4=2:1$, thin films containing diamond structures therein could be formed at 100 Torr at a temperature not lower than 400° C. In case of $CH_4:CF_4=1:1$, the formation temperature was 300° C. and the reaction pressure was 50 Torr. In case of $CH_4:CF_4=1:2$, thin films containing diamond structures could be formed at 200° C. and 10 Torr. While the pressure is preferably around atmosphere pressure, low temperatures as low as 500° C. is desirable because the choice of substrates to be coated becomes broad.

At temperatures not higher than 400° C., carbon deposition can be performed on a semiconductor substrate over an aluminium circuit formed thereon. AT temperatures not higher than 200° C., carbon coating on a plastic substrate becomes possible. At temperatures between 300° C. and 500° C., carbon coating can be deposited on glass substrates.

Figure 8A:
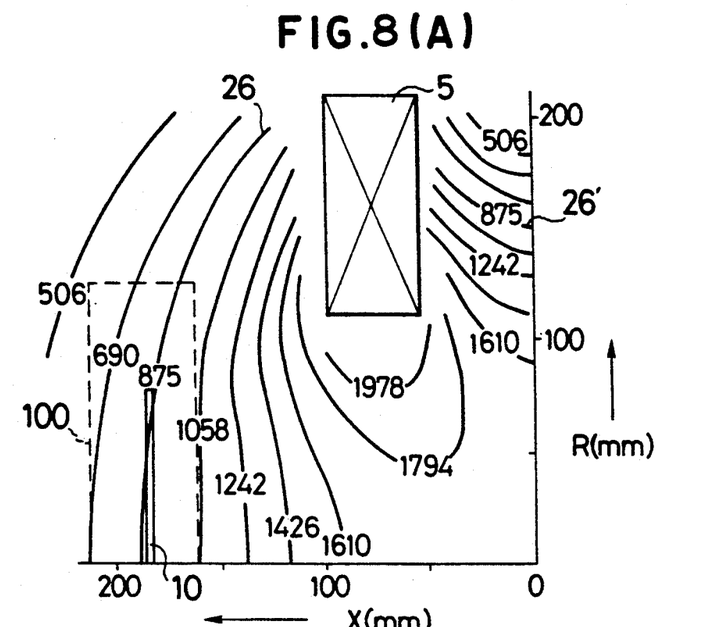
FIGS. 8(A) and 8(B) are graphical diagrams showing a computor simulation of the profiles of the equipotential surfaces of magnetic field in a cross section.
Figure 8B:
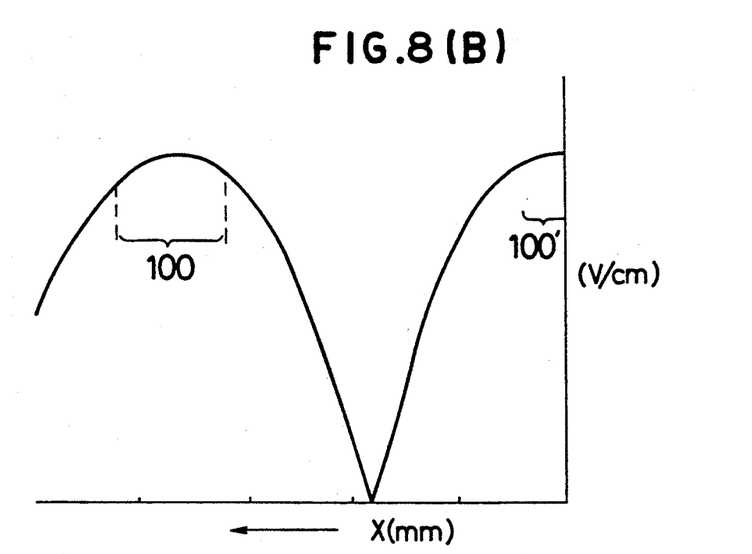
Figure 9A:
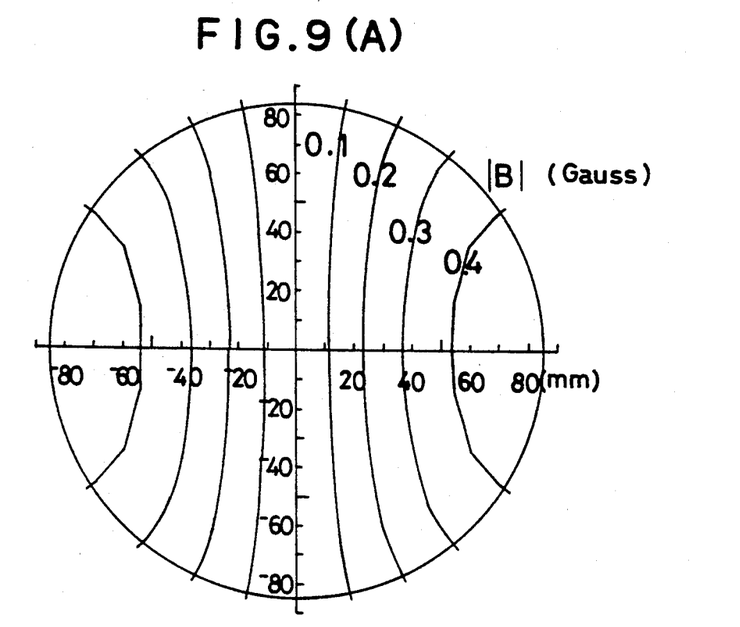
FIGS. 9(A) and 9(B) are graphical diagrams showing equipotential surfaces respectively in terms of magnetic field and electric fields of microwave energy propagating in a resonating space.
Figure 9B:
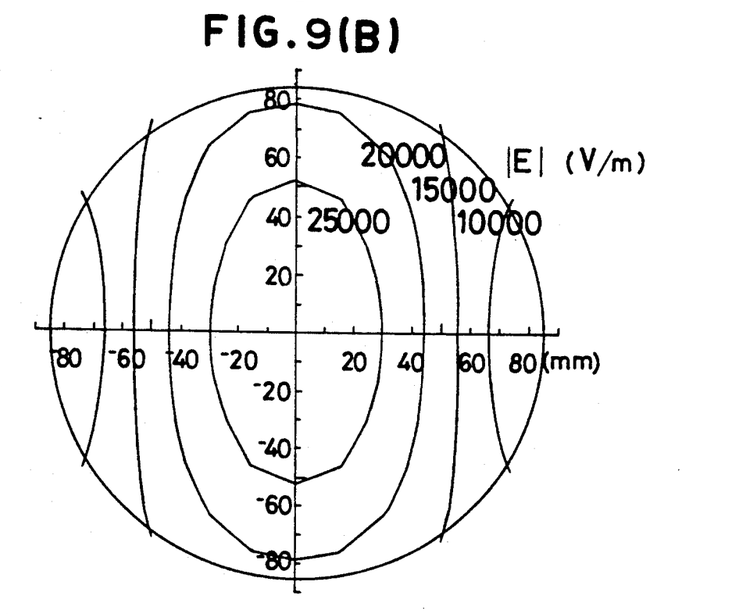

FIG. 8(A) is a graphical showing of the distribution of the magnetic field in the region 30 in FIG. 7. The curve in the diagram are plotted along equipotential surface and are given numerals indicating the strengths along the respective curves of the magnetic field induced by magnets 5 and 5' having a power of 2000 Gauss. By adjusting the power of the magnets 5 and 5', the strength of the magnetic field can be controlled so that the magnetic field becomes largely uniform over the surface to be coated which is located in the region 100 where the magnetic field (875±185) Gauss) and the electric field interact. In the diagram, the reference 26 designates the equipotential surface of 875 Gauss at which the conditions required for ECR (electron cyclotron resonance) between the magnetic field and the microwave frequency are satisfied. Of course, in accordance with the present invention, ECR can not be established due to the high pressure in the reaction chamber, but instead a mixed cyclotron resonance takes place in a broad region including the equipotential surface which satisfied ECR conditions. FIG. 8(B) is a graphical diagram in which the X-axis corresponds to that of FIG. 2(A) and which shows the strength of the electric field of a standing wave of the microwave energy in the plasma generating space 1. As shown, the electric field strength attains its maximum value in the regions 100 and 100', it is difficult to heat the substrate 10' without disturbing the propagation of the microwave energy. In other regions, a film will not be uniformly deposited, but will be deposited in the form of a doughnut. It is for this reason that the substrate 10 is disposed in the region 100. The plasma flows in the lateral direction. According to experiments, a uniform film can be formed on a circular substrate having a diameter of up to 100 mm, and a film can be formed in the chamber on a circular substrate having a diameter of up to 50 mm with a uniform thickness and a uniform quality. When a larger substrate is desired to be coated, the diameter of the space is doubled with respect to the vertical direction of FIG. 8(A) by making use of 1.225 GHz as the frequency of the microwave energy. FIG. 9(A) and FIG. 9(B) are graphical diagrams showing the distribution of the magnetic field and the electric field due to microwave energy emitted from the microwave generator 4 for a cross section of the plasma generating space 1. The curves in the circles of the figures are plotted along equipotential surfaces and given numerals showing the field strengths. As shown in FIG. 9(B), the electric field reaches its maximum value at 25 KV/m.

Figure 10:
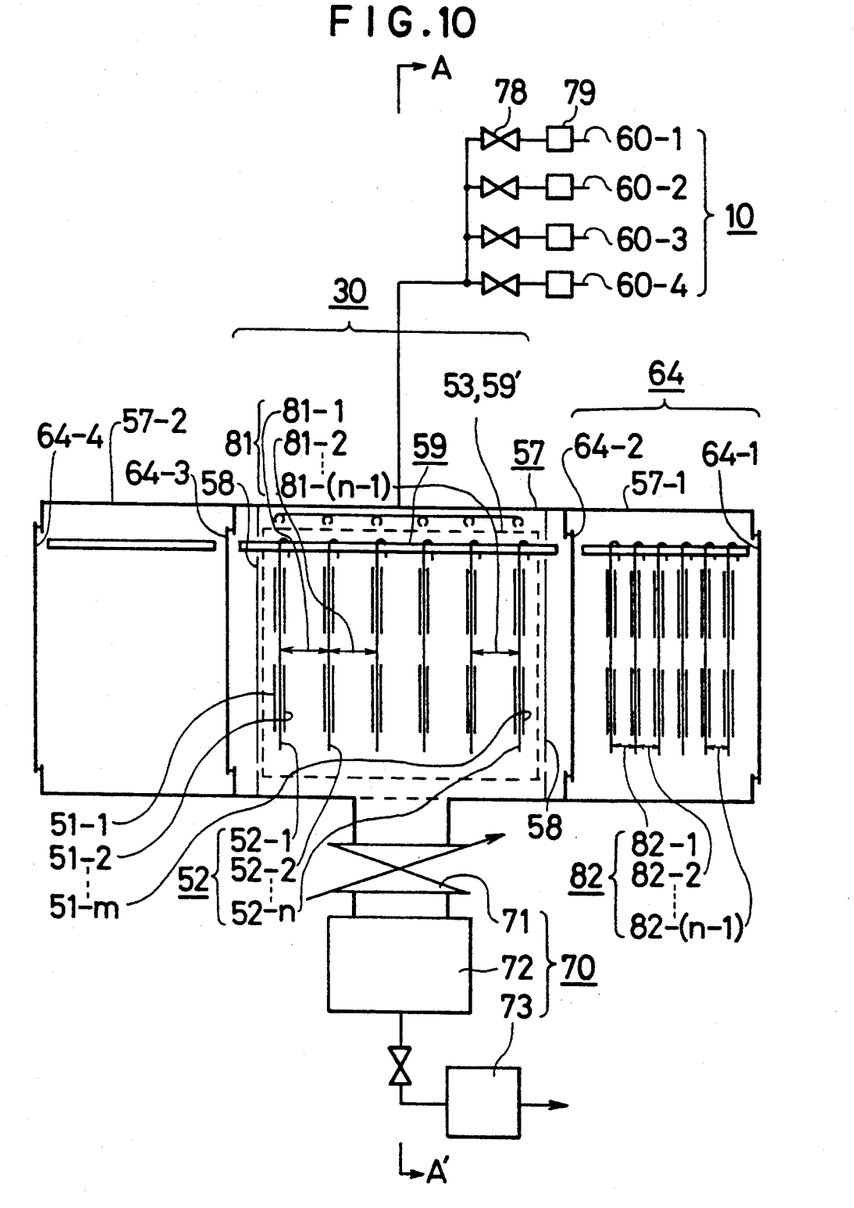
FIG. 10 is a cross section view showing a further CVD apparatus in accordance with the present invention.
Figure 11:
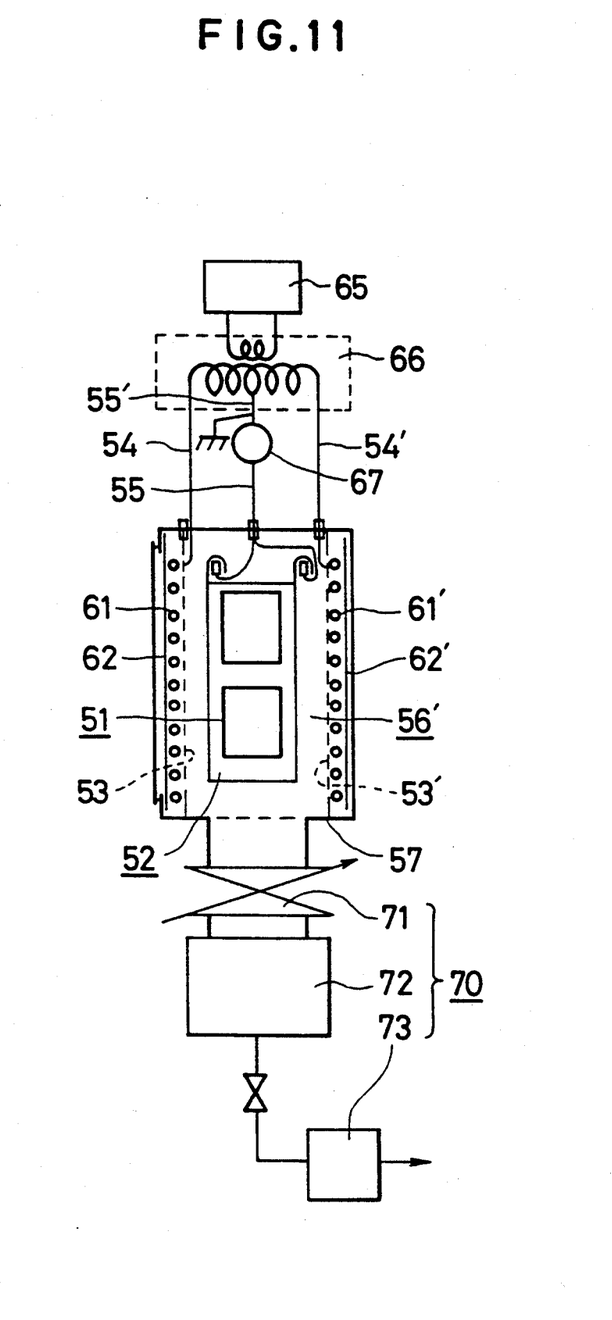
FIG. 11 is a cross section view showing a still further CVD apparatus in accordance with the present invention.

Next, a third embodiment will be described referring to FIGS. 10 and 11. A large size plasma treatment system comprises a reaction chamber 57 provided, with a loading chamber 57-1, an unloading chamber 57-2, a pair of guide rails 59 for suspending therefrom a plurality of substrate holders 52 made of aluminum or nickel plates, a high frequency electric power source 65 for supplying an electric power through a matching transformer 66, first and second metallic mesh electrodes 53 and 53' connected to the output terminals 54 and 54' of the transformer 66, the geometric area of each electrode being 150 cm$^2$ and the effective area of each electrode being 120 cm$^2$, an alternating electric power source 67 connected between the midpoint of the secondary coil of the transformer and the guide rails 59, a gas feeding system 60 consisting of four passages each of which is provided with a flow meter 57 and a valve 56, a nozzle 75 for inputting gases to the reaction chamber 57 from the gas feeding system 60, and an exhausting system 70 including a pressure control valve 71, a turbo molecular pump 72 and a rotary pump 73. A reaction space is defined within the reaction chamber by a four-sided hollow structure 58 and 58' of 160 cm width, 40 cm depth and 160 cm height for blocking deposition on the inside wall of the reaction chamber 57. The height of the hollow structure may be chosen between 20 cm and 5 m in general. One dimension of the electrodes 53 and 53' may be chosen between 30 cm and 3 m in general. There are provided gate valves 64-1 and 64-4 between the outside and the loading and unloading chambers 57-1 and 57-2 and gate valves 64-2 and 64-3 between the reaction chamber 57 and the loading and unloading chambers 57-1 and 57-2 for sealing off. The inside of the reaction chamber 57 is provided with a heater consisting of a plurality of halogen lamps 61 and 61'.

A plurality of substrates 51-1, 51-2, . . . 51-n are mounted on the plurality of substrate holders 52-1, 52-2, . . . 52-n. The distances 81-1, 81-2, . . . between each adjacent holders in the reaction chamber 57 are selected substantially constant, the dispersion from the average being within ±20%. The corresponding distances in the loading chamber are selected narrower for the purpose of designing the system compact. In this arrangement, only one side surface of each substrate is coated. If coating of both surfaces is desired, the substrates are supported in openings formed on the holders. Introduced to the reaction chamber 57 are a carrier gas of argon or hydrogen from the passage 60-1 of the gas feeding system, a reactive gas of a hydrocarbon such as methane or ethylene from the passage 60-2 and a halogen compound gas such as $NF_3$ from the passage 60-3. The pressure of the reactive gas os 0.001 to 1.0 Torr, e.g. 0.05 Torr. The substrate temperature is −100° C. (in case with a cooling system) or up to 150° C.

A first alternating voltage is applied between the mesh electrodes 53 and 53' at a high frequency of 1 MHz to 6 GHz, e.g. 13.56 MHz while a second alternating voltage is applied between the midpoint of the secondary coil and the rails 59 at a frequency of 1 KHz to 500 KHz, e.g. 50 KHz. The input power of the first alternating voltage is 1.0 KW to 30 KW (equivalent to a plasma energy of 0.04–1.3 KW/cm$^2$), e.g. 10 KW (equivalent to a plasma energy of 0.44 W/cm$^2$). The second alternating voltage functions to apply a AC bias voltage of $-200$ to 600 V (equivalent to 500 W) at the substrate surface. By virtue of this electric power, a plasma gas is generated in the reaction chamber 57 and initiates chemical vapor reaction. The exhausted gas is removed through the evacuation system 70.

In what follow, experimental results will be described in detail which have been obtained in accordance with the aforementioned embodiments and combination thereof.

EXPERIMENT 1

Figure 12:
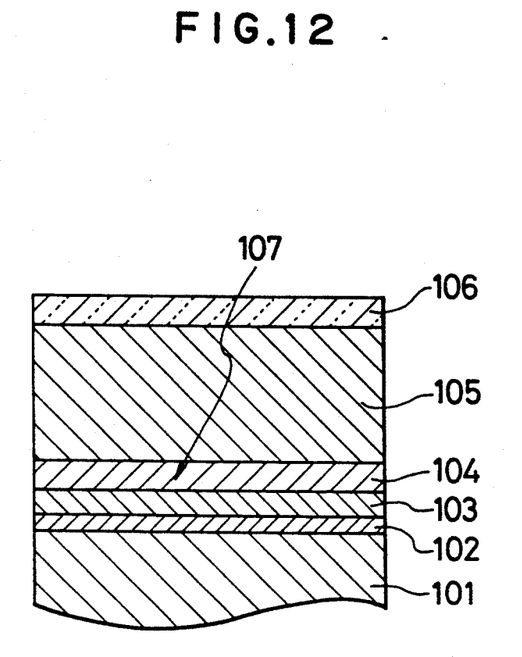
FIGS. 12, 13 and 14 are cross sectional views showing devices formed in accordance with the present invention.

In accordance with the present invention, a photosensitive structure for used in electron photography was formed as illustrated in FIG. 12. The structure comprises a PTE sheet 101 of 20 microns thickness, an Aluminium film 102 of 600 Å thickness formed by vacuum evaporation, an intermediate film 103, a charge generating film 1-4 of 0.6–1.2 microns thickness, a charge transfer film 105 of 20 microns thickness and a passivation film 106 formed in accordance with the present invention.

If the passivation film or the charge generating film is given a negative electric charge, some portion of the structure receiving light rays 107 can be neutralized by holes generated in the charge generating film 104 which reach the passivation film 106 through the charge transfer film 105. In this case, electrons generated in the charge generating film 104 are drained through the intermediate film and the alminium film. Other region which does not receive light rays attracts toner and transfers it to the surface of a paper to construct an image in accordance with the existence or absence of incident light rays.

The resistivity of the passivation film 106 was controlled to be $10^{11}$ to $10^9$ ohm cm by adjusting the flow rate of NF$_3$. By virtue of such a high resistivity, it was avoided that the boundary of the constructed image became out of focus due to lateral drift of charge. Accordingly, the formed image became clear with high contrast. On the other hand, if the resistivity were too high, residual charge might be accumulated after repeating charge and discharge. This adverse accumulation could be avoided by precisely controlling the resistivity in accordance with the present invention. The transmissivity of the passivasion film was not lower than 80% to light rays of 500 nm or longer wavelengths, and not lower than 60% to light rays of 400 nm or longer wavelength. Accordingly, the structure can be employed for application making use of wavelengths of visible lights.

Furthermore, the passivation film was abrasion-proof and scratching-proof and superior in adhesivity with lower internal stress. No crack and no peeling was caused in the photosensitive film on the flexible sheet even when the sheet was bent at a radius of curvature of 10 mm. This experiment was made for application to a sheet-like organic photosensitive structure. However, similar structures can be formed in the same manner as photosensitive drums, amorphous silicon photosensitive structures and selenium photosensitive structures.

This Example was repeated in the same manner with the following exception. The passivation film in this case was composed of two layers. The lower layer was deposited at a NF$_3$ flow rate not higher than 0.1 SCCM for beginning two minutes and then the upper layer was deposited at 100 SCCM for the subsequent 20 minutes.

The resistivity, the transparency, the hardness, the internal stress and the other characteristics were depending almost on the property of the upper layer. Only the adhesivity depended on the lower layer which made the sturdy mechanical contact. The resistivity was measured to be $10^{11}$ to $10^9$ ohm cm.

Another layer may be further deposited over the upper layer with a fewer fluoride proportion to raise the hardness of the external surface of the passivation film.

EXAMPLE 2

The present invention was applied to film coating on an IC chip after wire bonding on lead structure for reliability. The carbon film was composed of two layers. The lower layer was deposited to a thickness of 0.6 micron at a flow rate such that $C_2H_2/NF_3=1:1$ whose internal stress was measured to be $10^7$ dyn/cm. The upper layer was deposited to 0.1 micron at flow rate such that $C_2H_2/NF_3=100:1$ whose vickers hardness was measured to be 2000 kg/cm$^2$.

The small internal stress in accordance with the present invention was effective for avoiding disconnection of gold wire from alumnium pads due to internal stress, along with another advantage that the lower layer prevents water and alkaline from entering into the structure.

EXAMPLE 3

Figure 13:
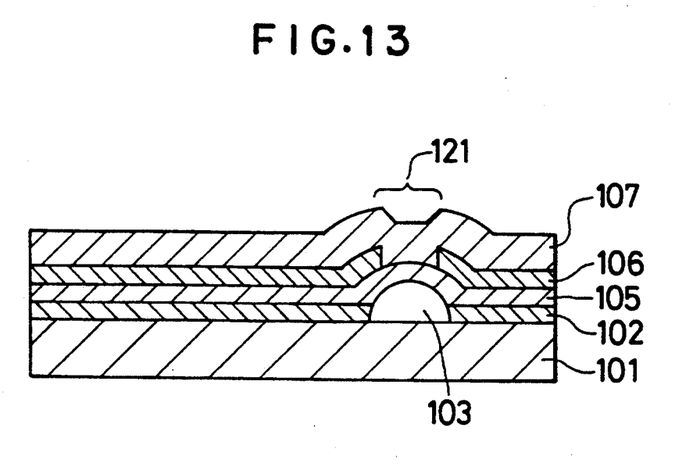

A representative structure of a thermal printer head is illustrated in FIG. 13. A glaze film 102 was formed on an insulating substrate 101 with a protruding glaze 103 which was to be a heat generating part. On this structure, a heating film 105 and an electrically conductive film 106 were laminated sequentially followed by photolithography to form a window corresponding to a heat generating element 121. Then, a carbon containing passivation film 107 was formed over the upper surface of the structure in accordance with the present invention.

While conventional passivation films are inorganic films such as silicon nitride films as thick as 5 microns, the passivation films, in accordance with this invention, can be as thin as 1 micron since the hardness can be controlled not lower than a Vickers hardness of 2000 kg/mm$^2$ by adjusting the rate of NF$_3$.

Furthermore, the internal stress of the films formed in accordance with the present invention was about $10^9$ dyn/cm$^2$ and the property of the film was not degraded even after leaving at 100° C. in air for an hour. The resistivity on the order of $10^{10}$ ohm cm is suitable for avoiding static electricity, and as a result, dust can be eliminated which may be cause of scratchs or malfunction of electric circuits. The heat generating film may be made of conventional materials or made of a carbon film whose halogen proportion is controlled so that the conductivity is $10^3$ to $10^4$ ohm cm.

EXAMPLE 4

Figure 14:
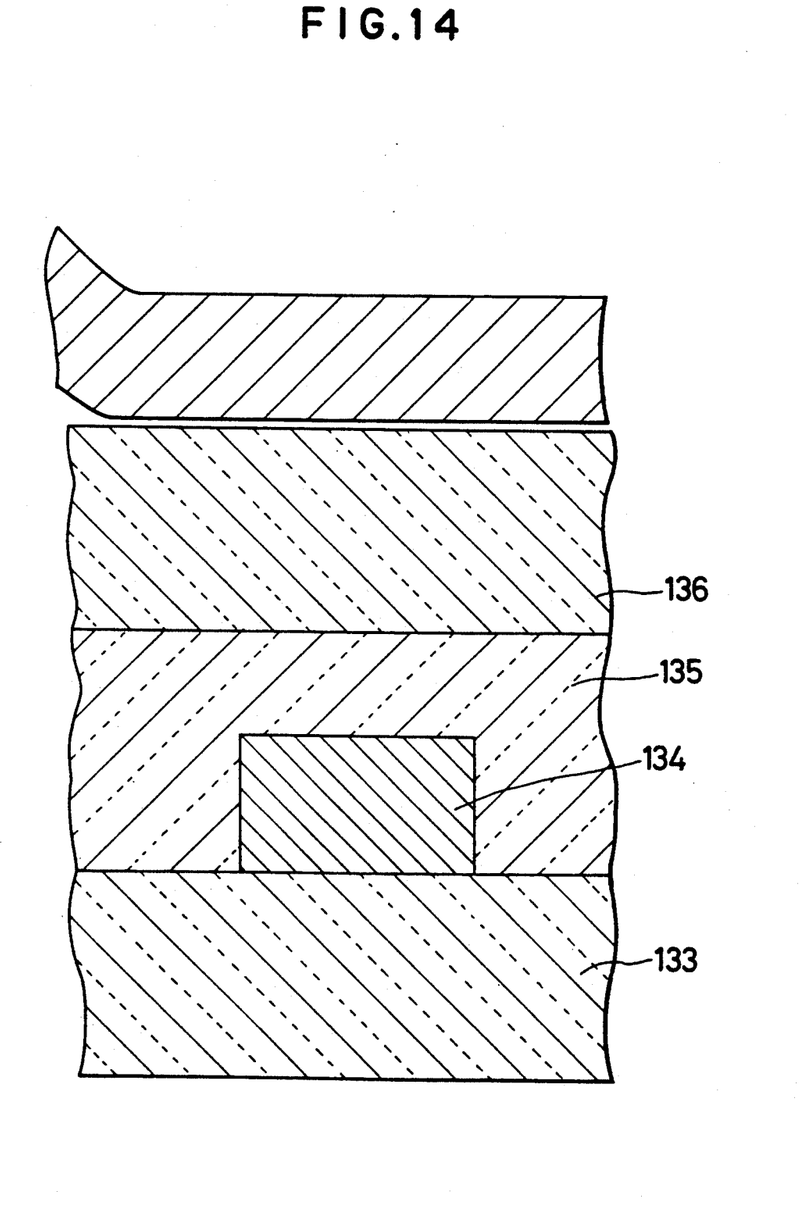

FIG. 14 is a partial view showing a contact image sensor formed in accordance with the present invention. A photosensor 134 was formed on a transparent glass substrate 133 by patterning an amorphous silicon film and conductive films formed by a known CVD making use of an eximer laser. A transparent polyimide film 135 was formed on the substrate 133 over the sensor 134. A passivation film 136 was deposited on the polyimide film 135 to a thickness of 2.0 microns.

The Vickers hardness was measured to be 2500 kg/mm$^2$ and the resistivity was measured to be $1\times 10^5$ ohm cm. Since the carbon passivation film 136 has a high hardness and an improved insulating capability which are comparable to those of diamond. For this reason, the surface has sufficient resistivity against abrasion due to unevenness of a paper or due to a staple.

In accordance with the present invention, improved carbon films or clusters can be formed. The effect of the invention has been confirmed in regard to carbon deposition, and therefore it is advantageous to apply the present invention to the formation of any films containing carbon whose proportion is not lower than 50%.

While a description has been made for several embodiments, the present invention should be limited only by the appended claims and should not be limited by the particular examples, and there may be caused by an artisan some modifications and variations according to the invention. For example, it has been proved effective to add boron, nitrogen, phosphorus or the like into the carbon.

I claim:

1. A cyclotron resonance chemical vapor deposition method of forming a halogen containing diamond on a substrate comprising:
    inputting at least one reactive gas comprising carbon and a halogen into a reaction chamber;
    emitting a microwave into said reaction chamber at a predetermined frequency and in a predetermined direction;
    establishing a magnetic field in said reaction chamber where the direction of the magnetic field is substantially parallel to the direction of the microwave and the strength of the magnetic field is such as to cause cyclotron resonance at a predetermined position in the reaction chamber;
    exhausting the reaction chamber to establish in the chamber a pressure range of 0.1 to 300 Torr;
    holding the substrate approximately at said predetermined, cyclotron resonance position in the reaction chamber; and
    depositing said halogen containing carbon layer containing a diamond structure at least locally on a surface of the substrate.

2. A method as in claim 1 where said cyclotron resonance is mixed cyclotron resonance.

3. A method as in claim 1 where said reactive gas includes a fluorine compound gas.

4. The method of claim 1 wherein the frequency of said microwave power is not lower than 500 MHz.

5. A method as in claim 1 where said reactive gas includes a halogen compound gas.

6. The method of claim 5 wherein said halogen compound gas is diluted with hydrogen or a gaseous oxide or is introduced together with hydrogen or a gaseous oxide.

7. The method of claim 5 wherein said halogen compound gas is a fluorine compound gas.

8. The method of claim 1 wherein the substrate is made of a glass, a metal, a ceramic, or an organic resin.

9. A cyclotron resonance chemical vapor deposition method of forming a halogen containing diamond on a substrate comprising the steps of:
    inputting at least one reactive gas comprising carbon and a halogen into a reaction chamber;
    emitting a microwave into said reaction chamber at a predetermined frequency and in a predetermined direction;
    establishing a stationary wave of said microwave in the reaction chamber;
    holding said substrate substantially at a position where said stationary wave attains a maximum value;
    establishing a magnetic field in said reaction chamber where the direction of the magnetic field is substantially parallel to the direction of the microwave and the strength of the magnetic field is such as to cause cyclotron resonance at approximately the position where the substrate is held in the reaction chamber;
    exhausting the reaction chamber to establish in the chamber a pressure range of 0.1 to 300 Torr; and
    depositing said halogen containing carbon layer containing a diamond structure at least locally on a surface of the substrate.

10. A method as in claim 9 where said cyclotron resonance is mixed cyclotron resonance.

* * * * *